(12) United States Patent
Hirose et al.

(10) Patent No.: US 7,660,495 B2
(45) Date of Patent: Feb. 9, 2010

(54) PACKAGE ELEMENTS AND METHODS FOR SECURING A GETTER

(75) Inventors: Yukie Hirose, Yokosuka (JP); Yasuhiro Fukuyama, Yokosuka (JP)

(73) Assignee: Nissan Motor Co., Ltd., Yokohama-shi, Kanagawa (JP)

( * ) Notice: Subject to any disclaimer, the term of this patent is extended or adjusted under 35 U.S.C. 154(b) by 711 days.

(21) Appl. No.: 11/312,899

(22) Filed: Dec. 20, 2005

(65) Prior Publication Data

US 2006/0132036 A1 Jun. 22, 2006

(30) Foreign Application Priority Data

Dec. 22, 2004 (JP) ............... 2004-371553

(51) Int. Cl.
*G02B 6/00* (2006.01)
*H01J 7/18* (2006.01)
*H01J 61/26* (2006.01)

(52) U.S. Cl. ............... 385/13; 385/12; 385/92; 313/561

(58) Field of Classification Search ............... 385/14, 385/31, 12, 13, 88, 89, 92, 93, 94; 313/561; 250/227.11, 227.14, 231
See application file for complete search history.

(56) References Cited

U.S. PATENT DOCUMENTS

| | | | | |
|---|---|---|---|---|
| 4,630,095 A | * | 12/1986 | Otsuka et al. | ............... 257/660 |
| 6,203,869 B1 | * | 3/2001 | Dougherty et al. | .......... 428/35.7 |
| 6,251,344 B1 | * | 6/2001 | Goldstein | .................... 422/123 |
| 6,291,061 B1 | | 9/2001 | LeMay et al. | ............. 428/319.3 |
| 2005/0067718 A1 | * | 3/2005 | Frischknecht | ................ 257/787 |
| 2006/0076634 A1 | * | 4/2006 | Palmateer et al. | ............ 257/415 |
| 2006/0132036 A1 | * | 6/2006 | Hirose et al. | ................. 313/561 |
| 2006/0166407 A1 | * | 7/2006 | Kaushal et al. | .............. 438/115 |
| 2009/0215610 A1 | * | 8/2009 | Kullberg et al. | ................ 502/56 |

FOREIGN PATENT DOCUMENTS

| | | | | |
|---|---|---|---|---|
| EP | 0 720 260 A1 | 7/1996 | ............... | 385/12 X |
| GB | 935 925 | 9/1963 | ............... | 385/12 X |
| JP | 2003-004524 A | 1/2003 | ............... | 385/12 X |
| JP | 2004-146599 | 5/2004 | ............... | 385/12 X |

* cited by examiner

*Primary Examiner*—Brian M Healy
(74) *Attorney, Agent, or Firm*—Young Basile (57) ABSTRACT

A getter sheet is secured within a package element in a condition of elastic deformation by positioning the getter sheet between a base and a cap of a package with at least one portion of the getter sheet in contact with the package. When positioned within the package, the condition of elastic deformation may force the getter sheet into a vaulted form. Therefore, the getter sheet may be secured within the package without utilizing any additional parts or fasteners. The getter sheet comprises particulates of a getter applied to a sheet of material. The getter sheet may comprise a rectangular shape, an elliptical shape, or an octagonal shape. The getter sheet may be secured within the package when at least one portion of the getter sheet contacts one or more of a side surface of the cap, a bottom surface of the cap, and a top surface of the base.

30 Claims, 7 Drawing Sheets

PACKAGE ELEMENTS AND METHODS FOR SECURING A GETTER

This application claims priority from Japanese Patent Application No. 2004-371553, filed Dec. 22, 2004, the entire content of which is incorporated herein by reference.

TECHNICAL FIELD

The invention relates to package elements and methods for securing a getter within a packet element.

BACKGROUND

A conventional package element may consist of a package that forms a vacuum enclosure. Often a getter is used to absorb existing gases within the package. In some packages, a holder is used to hold particulates of the getter. However, securing the holder and the getter within the package often results in increased production time and costs for the package element. In addition, the conventional package element includes an increased number of parts, which may also increase production time and costs for the package element.

SUMMARY

In general, the invention is directed to techniques for securing a getter sheet within a package element in a condition of elastic deformation by positioning a getter sheet between a base and a cap of a package with at least one portion of the getter sheet in contact with the package. When positioned within the package between the base and cap, the condition of elastic deformation may force the getter sheet into a vaulted form. The getter sheet comprises particulates of a getter applied to a sheet of material. The getter sheet may comprise a rectangular shape, an elliptical shape, an octagonal shape or another suitable shape.

The getter sheet may be secured within the package when at least one portion of the getter sheet contacts one or more of a side surface of the cap, a bottom surface of the cap, and a top surface of the base. Therefore, the getter sheet may be secured within the package without utilizing any additional parts or fasteners. In this way, the techniques described herein for securing the getter sheet within the package may reduce production time and costs for the package element.

In one embodiment, a package element comprises a package that includes a base and a cap, and a getter sheet positioned between the base and the cap with at least one portion of the getter sheet in contact with the package to secure the getter sheet within the package in a condition of elastic deformation.

In another embodiment, a method comprises forming a package with a base and a cap, and securing a getter sheet within the package in a condition of elastic deformation by positioning the getter sheet between the base and the cap with at least one portion of the getter sheet in contact with the package.

In another embodiment, a package element comprises means for forming a vacuum enclosure, and means for absorbing gasses within the vacuum enclosure positioned with at least one portion of the means in contact with the vacuum enclosure to secure the means within the vacuum enclosure in a condition of elastic deformation.

The details of one or more embodiments of the invention are set forth in the accompanying drawings and the description below. Other features, objects, and advantages of the invention will be apparent from the description and drawings, and from the claims.

DETAILED DESCRIPTION

FIGS. 1a-1d are cross-sectional view drawings illustrating a package element 1 in accordance with a first embodiment of the invention. In the example of FIGS. 1a-1d, package element 1 is a package element for an electronic device 6. Device 6 may comprise a sensor, an optical device, or any other device that requires a vacuum enclosure to operate properly. Package element 1 includes a package 2 that includes a base 3 and a cap 4, a getter sheet 5 securely positioned within package 2, device 6 mounted on base 3 within package 2, and electrical connection terminals 7 that are electrically connected to device 6.

Device 6 is enclosed within package 2 by mounting device 6 on a top surface of base 3 and covering device 6 with cap 4. Getter sheet 5 is positioned between base 3 and cap 4 to absorb any remaining gases left within package 2 after an air tight seal is formed between base 3 and cap 4. In addition, getter sheet 5 may absorb any additional gases emitted into package 2 when device 6 operates. In this way, getter sheet 5 may prevent any potential negative influences that excess gases may have on device 6. Getter sheet 5 may comprise particulates of a getter applied to a sheet of material.

In the illustrated embodiment, getter sheet 5 may be created by cutting a sheet of material. The sheet of material may be a sheet metal, such as nichrome, nickel, or another thin metal, to which gas absorbing particulates of a getter are thinly applied. The getter particulate may be applied to both sides of the sheet of material or to one side of the sheet of material. In addition, the sheet of material may be porous-sintered, making it possible to cut or fold the sheet of material to bend and create a shape.

In accordance with the first embodiment of the invention, getter sheet 5 is secured within package 2 in a condition of elastic deformation by positioning getter sheet 5 between base 3 and cap 4 with at least one portion of getter sheet 5 in forcible contact with package 2. As a result, the condition of elastic deformation forces getter sheet 5 into a vaulted form within package 2. Getter sheet 5 is able to absorb the gases effectively by maintaining a minimum amount of contact space between getter sheet 5 and package 2 in order to maximize exposure of getter sheet 5 to the vacuum space within package 2.

Unlike conventional techniques, the techniques described herein do not necessarily utilize additional parts or fasteners to secure a getter sheet within a package. For example, the package no longer requires a cup-shaped holder to secure the getter within the package. In this way, the techniques described herein may reduce the number of parts included within a package. Moreover, a welding process to attach a cup-shaped holder or any other parts to the package is no longer required. In this way, the structure of package element 1 remains simple and enables easy assembly of package element 1. Therefore, the production process may be simplified, and production costs may be reduced.

In addition, positioning getter sheet 5 such that at least one portion of getter sheet 5 is pressed against package 2 causes getter sheet 5 to become vaulted due to elastic deformation. In this way, getter sheet 5 is secured within package 2 with a simple formation that does not require a precise measurement of getter sheet 5. Furthermore, getter sheet 5 may be secured within package 2 by a simple process of inserting getter sheet 5 into package 2. Securing getter sheet 5 within package 2 prevents getter sheet 5 from moving within package 2. Therefore, the particulates of a gas absorbing material applied to getter sheet 5 can be prevented from falling off of getter sheet 5. In some cases, the particulate may fall off of getter sheet 5 onto outside surfaces of cap 4 as getter sheet 5 is positioned within cap 4, but the particulate can easily be dusted off of the outside surfaces of cap 4 by shaking cap 4.

In some embodiments, getter sheet 5 is shaped so as not to cover the top surface of base 3 completely. Instead, getter sheet 5 is shaped to create clearance between cap 4 and getter sheet 5 in order to maximize exposure of getter sheet 5 to the vacuum space within package 2. Therefore, getter sheet 5 may efficiently absorb any gases within package 2.

Figure 1A:
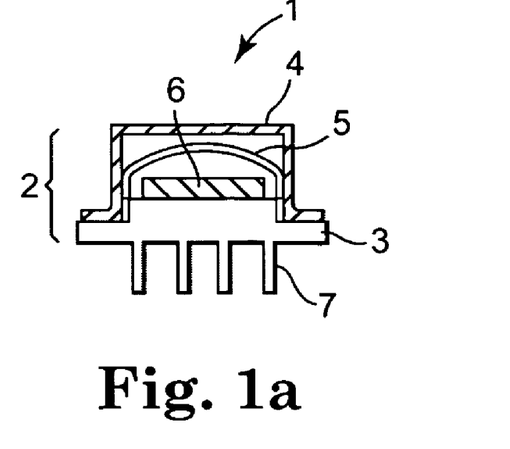
FIGS. 1a-1d are cross-sectional view drawings illustrating package elements in accordance with a first embodiment of the invention.
Figure 1B:
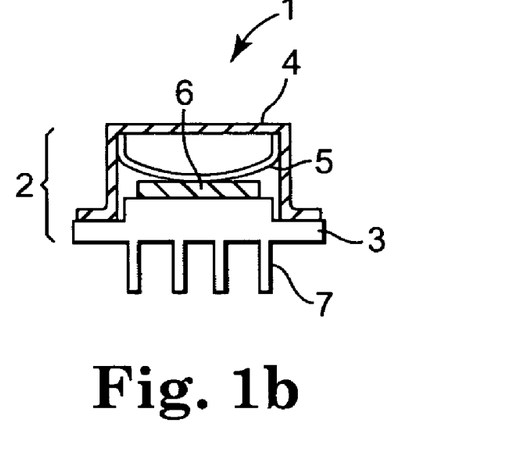
Figure 1C:
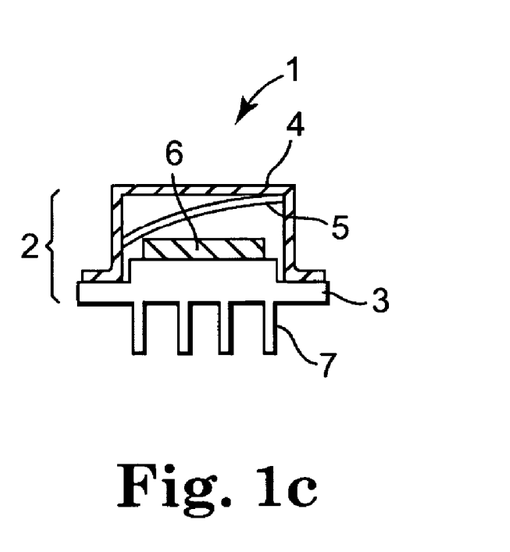
Figures 2A, 2B:
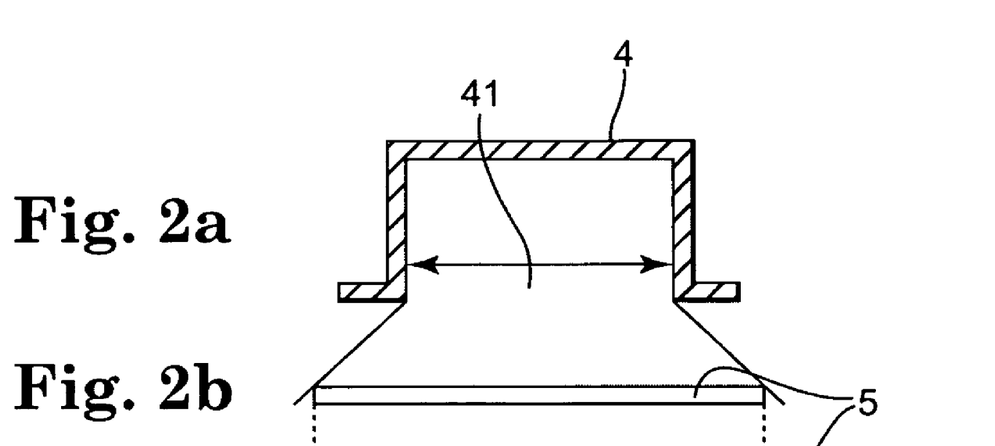
FIGS. 2a-2c are illustrations that show a getter sheet prior to being positioned between a cap and a base of the package element of FIGS. 1(a)-1(d).
Figure 2C:
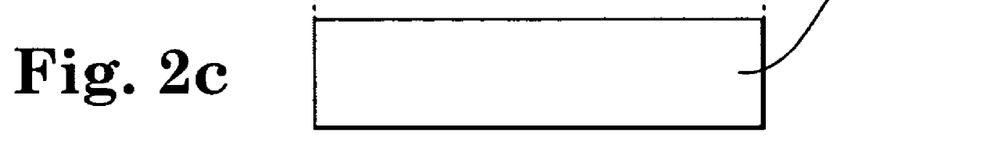

FIGS. 2a and 2b are illustrations that show getter sheet 5 prior to being positioned between base 3 and cap 4 of package element 1. FIG. 2a is a cross-sectional view drawing of cap 4 illustrating an aperture area 41 of cap 4. Cap 4 may comprise a round shape or a polygonal shape. FIG. 2b is a side view drawing of getter sheet 5, and FIG. 2c is a plan view drawing of getter sheet 5 before being positioned within package 2. FIGS. 2a-2c illustrate a form factor of getter sheet 5 wherein one side of getter sheet 5 is longer than an inside measurement of cap 4. In this manner, the form factor of getter sheet 5 is sized to secure getter sheet 5 within package 2 without utilizing additional parts or fasteners, as illustrated in FIGS. 1a-1c. In addition, the form factor of getter sheet 5 is sized to secure getter sheet 5 within package 2 regardless of the shape of cap 4.

Figure 3A:
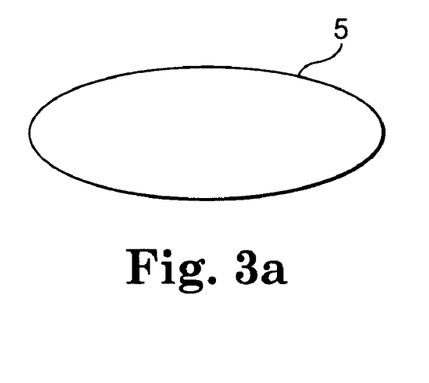
FIGS. 3a-3c are plan view drawings illustrating getter sheet shapes.
Figure 3B:
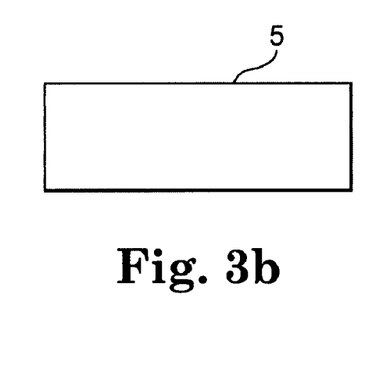
Figure 3C:
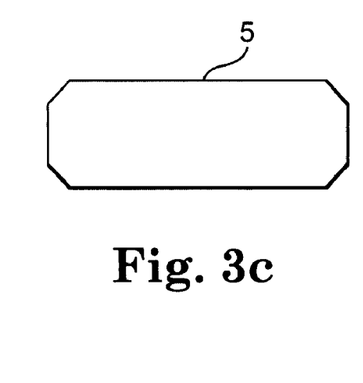

FIGS. 3a-3c are plan view drawings illustrating shapes of getter sheet 5. FIG. 3a illustrates getter sheet 5 as an elliptical shaped sheet. FIG. 3b illustrates getter sheet 5 as a rectangular shaped sheet. FIG. 3c illustrates a getter sheet 5 as an octagonal shaped sheet. For any of the illustrated shapes, the vertical to horizontal ratio of getter sheet 5 may be more than 2 to 1.

As illustrated in FIGS. 1a and 1b, getter sheet 5 may be secured as a dome shape and an inverted-dome shape, respectively, between a bottom surface of cap 4 and a top surface of base 3. Furthermore, as illustrated in FIG. 1c, getter sheet 5 may be secured as an oblique shape between the bottom surface of cap 4 and the top surface of base 3. Getter sheet 5 is secured within package 2 by having at least one portion of getter sheet 5 in contact with one or more side surfaces of cap 4, a bottom surface of cap 4 and a top surface of base 3. In this way, getter sheet 5 may be well secured within package 2 such that it is unlikely getter sheet 5 will be shifted within package 2.

FIG. 1a illustrates getter sheet 5 positioned in a dome shape. In that case, getter sheet 5 may be secured within package 2 when two ends of getter sheet 5 contact the top surface of base 3 and a side surface of cap 4. Positioning getter sheet 5 in the dome shape is effective when mounting a device 6 on the top surface of base 3 that is relatively tall in height. FIG. 1b illustrates getter sheet 5 positioned in an inverted-dome shape. In that case, getter sheet 5 may be secured within package 2 when two ends of getter sheet 5 contact the bottom surface of cap 4 and the side surface of cap 4.

One method of assembling package element 1 with getter sheet 5 in a dome shape or an inverted-dome shape is to position getter sheet 5 within package 2 by tucking getter sheet 5 into cap 4. In the case of the dome shape, as in FIG. 1a, in which two ends of getter sheet 5 contact the side surface of cap 4 facing aperture area 41 of cap 4, getter sheet 5 may be positioned by pushing base 3 into cap 4. Getter sheet 5 may be secured when the two ends also contact the top surface of base 3. In the case of the inverted-dome shape, as in FIG. 1b, in which the ends of getter sheet 5 contact the side surface of cap 4 and the bottom surface of the cap 4, getter sheet 5 may be positioned without pushing base 3 into cap 4. In either case, getter sheet 5 may be easily secured within package 2 without additionally securing parts, welding, or adhesives, which may lead to reduced production costs.

FIG. 1c illustrates getter sheet 5 positioned in an oblique shape. In that case, getter sheet 5 may be secured within package 2 when one end of getter sheet 5 contacts the top surface of base 3 and the side surface of cap 4 and another end of getter sheet 5 contacts the bottom surface of cap 4 and the side surface of cap 4. In this case, as one end of getter sheet 5 contacts the top surface of base 3, getter sheet 5 becomes better secured within package 2. Moreover, since only one end of getter sheet 5 is attached to the top surface of base 3, positioning getter sheet 5 in the oblique shape is effective when mounting a device 6 on the top surface of base 3 that is relatively large. In some embodiments, getter sheet 5 may be secured within package 2 in the oblique shape when the ends of getter sheet 5 contact only the side surface of cap 4 and the bottom surface the cap 4, or only the side surface of cap 4 and the top surface of base 3, or only the side surface of cap 4.

Figure 1D:
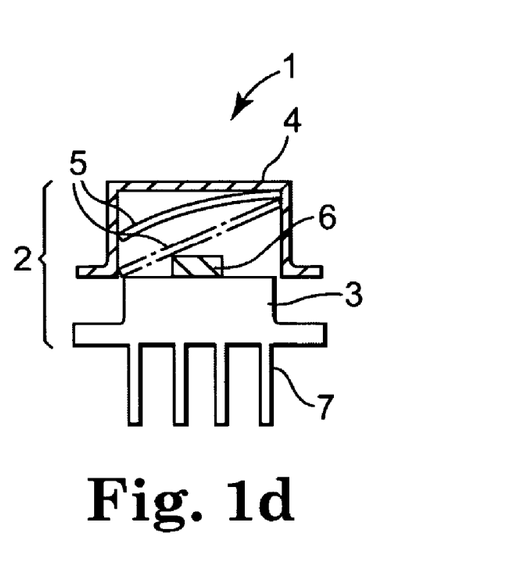

FIG. 1d illustrates one method of assembling package element 1 with getter sheet 5 in an oblique shape utilizing the elasticity of getter sheet 5. A first end of getter sheet 5 is initially inserted into cap 4 to contact the bottom surface of cap 4. Then, a second end of getter sheet 5 is fit opposite the first end to contact the side surface of cap 4 close to aperture area 41 of cap 4. By pushing base 3 into cap 4, the second end of getter sheet 5 may be secured by also contacting the top surface of the base 3. In either case, getter sheet 5 may be easily secured within package 2 without additionally securing parts, welding, or adhesives, which may lead to reduced production costs.

Securing getter sheet 5 within package 2 without additional parts or fasteners improves efficient gas absorption by getter sheet 5 by increasing the surface area of a sheet of material over which particulates of the getter may be applied. Therefore, even if the getter particulates are applied only on one side of getter sheet 5, the absorption ability of getter sheet 5 will be sufficiently effective. In the case in which the getter particulates are applied only on one side of getter sheet 5, the getter particulates are applied on the side of getter sheet 5 facing device 6 within package 2. In other embodiments, the getter particulates may also be applied on the side of getter sheet 5 facing away from device 6.

FIGS. 4a-4f are illustrations that show package element 1 in accordance with a second embodiment of the invention.

Figure 4A:
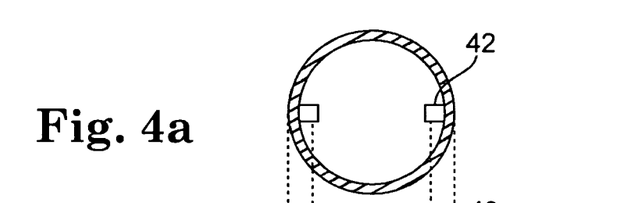
FIGS. 4a-4f are illustrations that show package elements in accordance with a second embodiment of the invention.
Figure 4B:
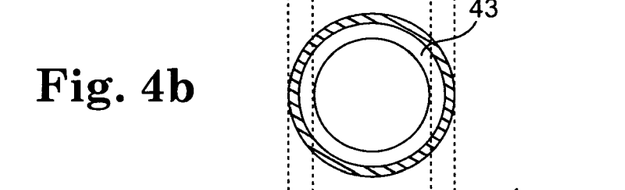

Package element 1 includes package 2 with base 3 and cap 4, getter sheet 5 secured within package 2, device 6 mounted on base 3 within package 2, and electrical connection terminals 7 that are electrically connected to device 6, as described above in reference to FIG. 1. FIG. 4*a* is a top view cross-sectional drawing of a first structure of cap 4 that includes lugs 42 positioned at two points opposite each other adjacent the side surface of cap 4. FIG. 4*b* is a top view cross-sectional drawing of a cap of a second structure of cap 4 that includes lug ring 43 positioned adjacent an entire circumference of the side surface of cap 4.

In the case of the first structure of cap 4, getter sheet 5 may be secured within package 2 in a condition of elastic deformation by positioning getter sheet 5 between base 3 and cap 4 with at least one end of getter sheet 5 in contact with at least one of lugs 42 positioned adjacent the side surface of cap 4. In the case of the second structure of cap 4, getter sheet 5 may be secured within package 2 in a condition of elastic deformation by positioning getter sheet 5 between base 3 and cap 4 with at least one end of getter sheet 5 in contact with lug ring 43 positioned adjacent the entire side surface of cap 4.

Figure 4C:
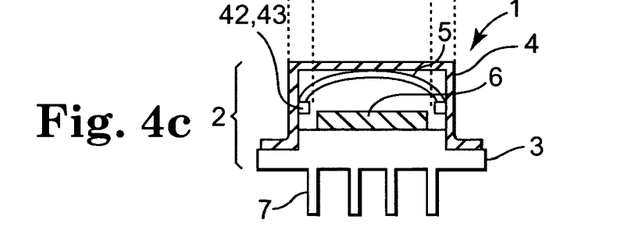
Figure 4D:
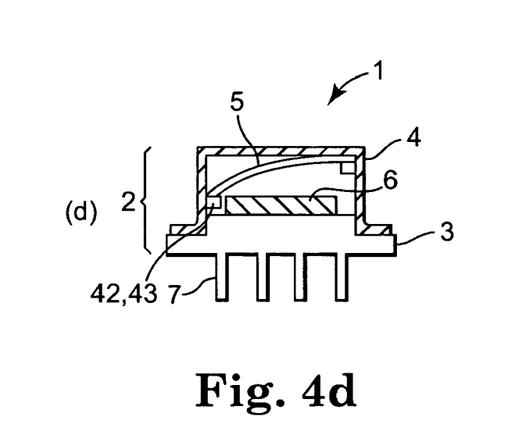

FIG. 4*c* is a cross-sectional view drawing of package element 1 illustrating getter sheet 5 secured within package 2 in a dome shape. FIG. 4*d* is a cross-sectional view drawing of package element 1 illustrating getter sheet 5 secured within package 2 in an oblique shape. FIG. 4*f* is a cross-sectional view drawing viewed perpendicularly to package element 1 of FIG. 4*c*.

Figure 4E:
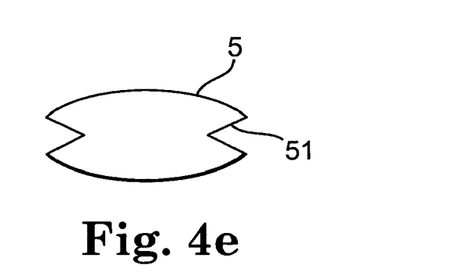
Figure 4F:
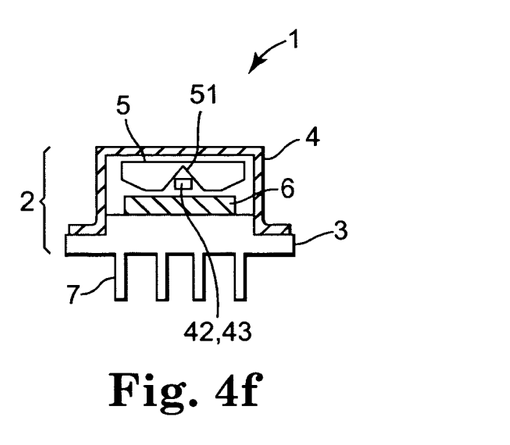

FIG. 4*e* is a plane drawing of an elliptical shaped getter sheet 5 including notches 51 provided at two opposite ends of the elliptical shaped getter sheet 5. In the case of getter sheet 5 secured in either a dome shape, FIG. 4*c*, or an oblique shape, FIG. 4*d*, getter sheet 5 may be secured within package 2 by clamping the two ends of getter sheet 5 including notches 51 onto lugs 42 positioned adjacent the side surface of cap 4. Moreover, getter sheet 5 may also be secured within package 2 by clamping the two ends of getter sheet 5 including notches 51 onto lug ring 43 positioned adjacent the entire side surface of cap 4.

In the illustrated embodiments, getter sheet 5 may be may effectively secured within package 2 when ends of getter sheet 5 contact only the side surface of cap 4 and without contacting the top surface of base 3. Lugs 42 or lug ring 43 provide an effective means of securing getter sheet 5 at a given position when inserted into cap 4 before getter sheet 5 is pushed in by base 3.

Figure 5:
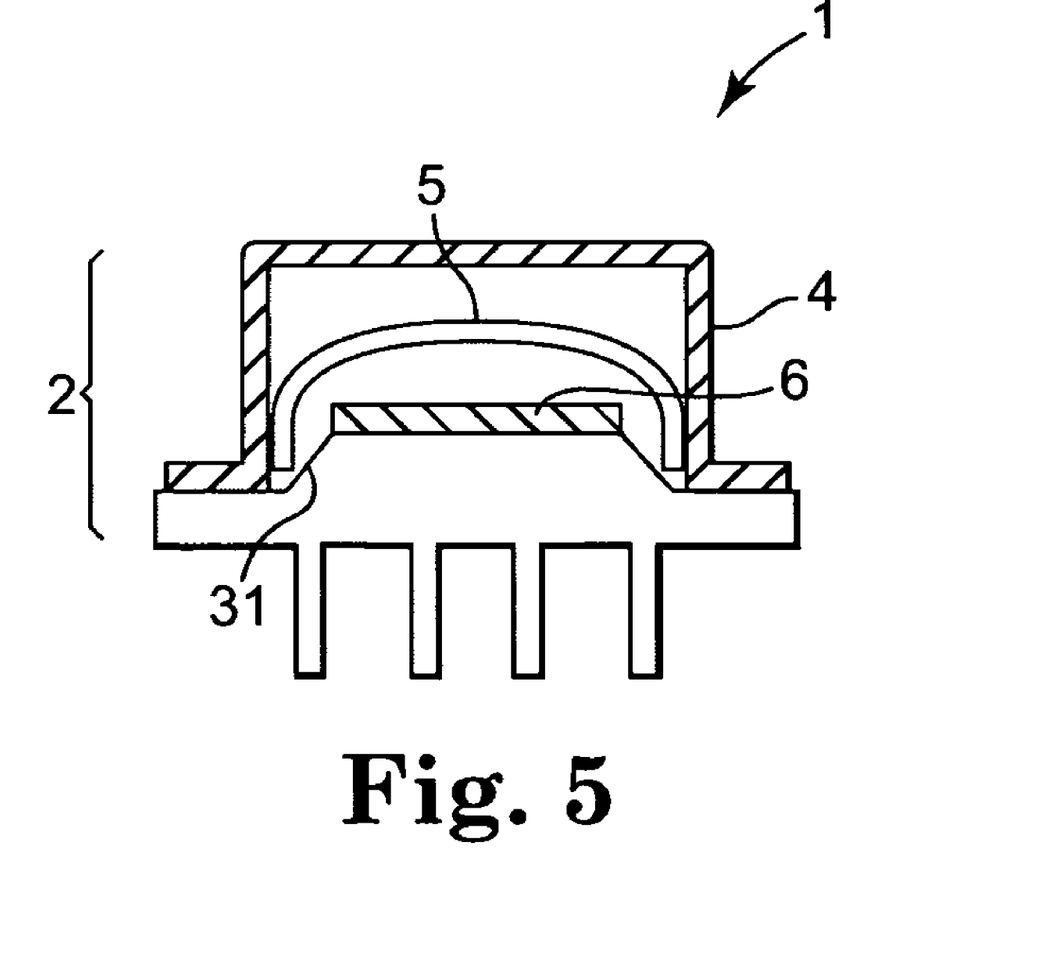
FIG. 5 is a cross-sectional view drawing illustrating a package element in accordance with a third embodiment of the invention.

FIG. 5 is a cross-sectional view drawing illustrating package element 1 in accordance with a third embodiment of the invention. Package element 1 includes package 2 with base 3 and cap 4, getter sheet 5 secured within package 2, device 6 mounted on base 3 within package 2, and electrical connection terminals 7 that are electrically connected to device 6, as described above in reference to FIGS. 1*a*-1*d*. In FIG. 5, base 3 includes slope areas 31 along the sides of base 3.

In accordance with the third embodiment of the invention, getter sheet 5 is secured within package 2 when two ends of getter sheet 5 are inserted between slope areas 31 of base 3 and the side surface of cap 4. By preparing slope areas 31 along the sides of base 3, a space becomes available between the sides of base 3 and the side surface of cap 4. In this way, getter sheet 5 may be effectively secured within package 2 by sandwiching the ends of getter sheet 5 into the available space.

This embodiment may be typically utilized when lugs 42 or lug ring 43, FIGS. 4*a* and 4*b*, are not positioned adjacent the side surface of cap 4. In addition, this embodiment may be utilized to secure getter sheet 5 within package 2 in an attempt to provide additional space between getter sheet 5 and the side surface of cap 4. Moreover, in other embodiments, getter sheet 5 may be secured within package 2 by inserting the ends of getter sheet 5 into dents formed in the top surface of base 3 instead of inserting the ends of getter sheet 5 into slope areas 31 along the sides of the base 3.

FIGS. 6*a*-6*d* are illustrations that show package elements in accordance with a fourth embodiment of the invention. Package element 1 includes package 2 with base 3 and cap 4, getter sheet 5 secured within package 2, device 6 mounted on base 3 within package 2, and electrical connection terminals 7 that are electrically connected to device 6, as described above in reference to FIG. 1.

Figure 6A:
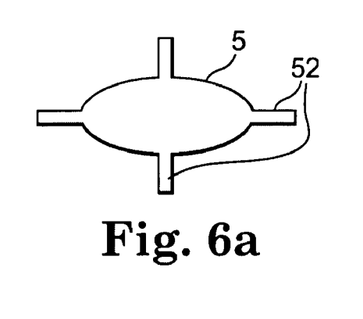
FIGS. 6a-6g are illustrations that show package elements in accordance with a fourth embodiment of the invention.
Figure 6B:
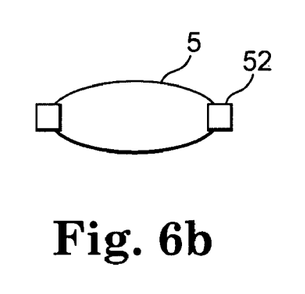
Figure 6C:
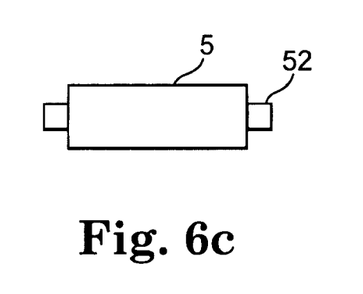
Figure 6D:
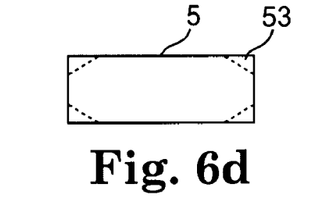

FIGS. 6*a*-6*c* are plan view drawings of a first structure of getter sheet 5 that includes one or more tabs 52 positioned at the ends of getter sheet 5. FIG. 6*a* illustrates four tabs 52 on each side of elliptical shaped getter sheet 5. FIG. 6*b* illustrates two tabs 52 on opposite sides of elliptical shaped getter sheet 5. FIG. 6*c* illustrates two tabs 52 on opposite sides of rectangular shaped getter sheet 5. In other embodiments, the shapes or positions of tabs 52 may vary. In addition, getter particulates may be applied to tabs 52. FIG. 6*d* is a plan view drawing of a second structure of getter sheet 5 including tabs formed by folding back folding areas 53 positioned on the corners of getter sheet 5. Once folding areas 53 are folded back, getter sheet 5 comprises an octagonal shape.

In the case of the first structure of getter sheet 5, getter sheet 5 is secured within package 2 when tabs 52 contact one or more of the side surface of cap 4, the bottom surface of cap 4 and the top surface of base 3. In the case of the second structure of getter sheet 5, getter sheet 5 is secured within package 2 when the tabs formed by folding back folding areas 53 contact one or more of the side surfaces of cap 4, the bottom surface of cap 4 and the top surface of base 3.

Figure 6E:
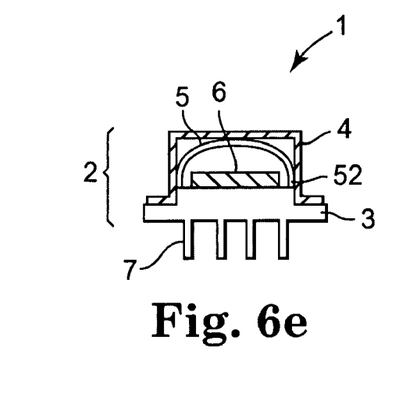
Figure 6F:
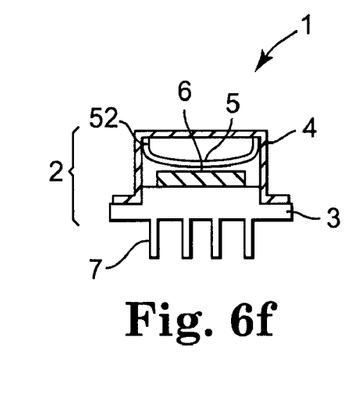
Figure 6G:
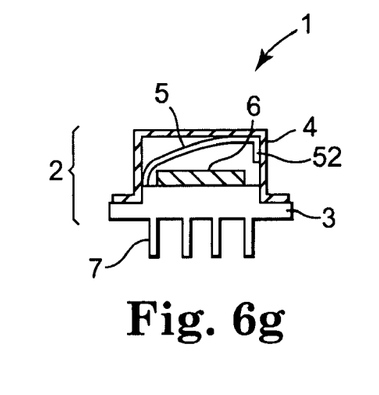

FIGS. 6*e*-6*g* are cross-sectional view drawings of package element 1 illustrating getter sheet 5 secured within package 2 in a dome shape, an inverted-dome shape and an oblique shape, respectively. In the case of a dome shape, as in FIG. 6*e*, getter sheet 5 is secured within package 2 by having tabs 52 or the tabs formed by folding areas 53 in contact with the side surface of cap 4 and the top surface of base 3. Positioning getter sheet 5 in the dome shape is effective when mounting a device 6 on the top surface of base 3 that is relatively tall in height.

In the case of an inverted-dome shape, as in FIG. 6*f*, getter sheet 5 is secured within package 2 by having tabs 52 or the tabs formed by folding areas 53 in contact with the side surface of cap 4 and the bottom surface of cap 4. In the case of an oblique shape, as in FIG. 6*g*, getter sheet 5 is secured within package 2 by having tabs 52 or the tabs formed by folding areas 53 in contact with the side surface of cap 4, the bottom surface of cap 4 and the top surface of base 3.

In this embodiment, getter sheet 5 may be effectively secured within package 2 due to the fact that surfaces of tabs 52 or of the tabs formed by folding areas 53 increase the area of contact with the side surface of cap 4. In this way, the securing characteristics of getter sheet 5 may be enhanced, and any movement of getter sheet 5 within package 2 may be effectively prevented. Furthermore, as illustrated in FIGS. 6*e* and 6*g*, when getter sheet 5 contacts the top surface of the base 3, tabs 52 or the tabs formed by folding areas 53 act as legs to hold getter sheet 5 over the top surface of base 3. In this way, height adjustments can be carried out between getter sheet 5 and device 6 mounted on the top surface of base 3.

FIGS. 7*a*-7*e* are illustrations that show package element 1 in accordance with a fifth embodiment of the invention. Package element 1 includes package 2 with base 3 and cap 4, getter sheet 5 secured within package 2, device 6 mounted on base 3 within package 2, and electrical connection terminals 7 that are electrically connected to device 6, as described above in reference to FIGS. 1a-1d.

Figures 7A, 7B:
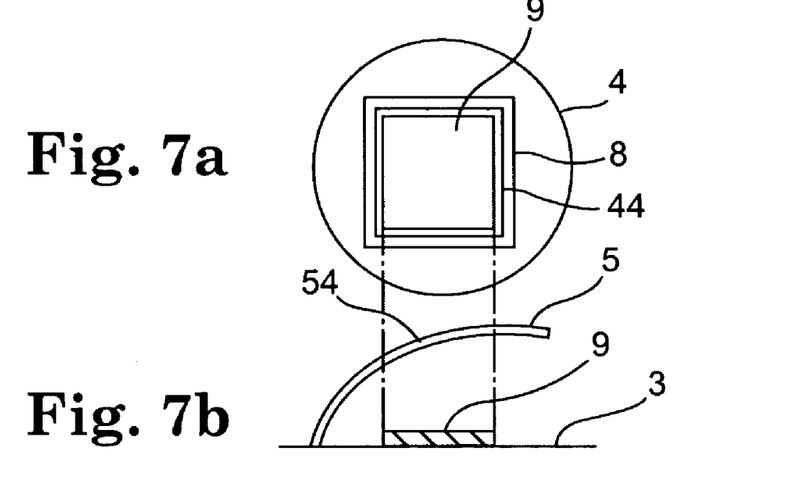
FIGS. 7a-7e are illustrations that show package elements in accordance with a fifth embodiment of the invention.

FIG. 7a is a top view drawing of package element 1, and FIG. 7b is a schematic cross-sectional drawing of the main parts of package element 1. In the illustrated embodiment, package element 1 includes an optical device 9 mounted on the top surface of base 3 within package 2. Optical device 9 may comprise an optical sensor, such as an infrared sensor, or any other device that requires incident light to operate properly. In addition, cap 4 includes an optical transmission window 8 and getter sheet 5 includes an aperture 54. In this way, package element 1 allows light to pass through optical transmission window 8 in cap 4 and aperture 54 in getter sheet 5 to optical device 9. The light may pass through optical transmission window 8 into a light-intake area 44 within package 2 before passing though aperture 54 to optical device 9. Optical transmission window 8 may cover a light-intake area 44 located on a top surface of cap 4 outside of package 2. Aperture 54 comprises a light penetration area created in getter sheet 5 according to the shape and size of optical device 9.

Furthermore, getter sheet 5 may be secured within package 2 in a condition of elastic deformation by positioning getter sheet 5 between base 3 and cap 4 with at least one end of getter sheet 5 in contact with a portion of package 2. Getter sheet 5 may be secured within package 2 using any of the techniques described above. As a result, the condition of elastic deformation may force getter sheet 5 into a vaulted form within package 2. Getter sheet 5 is able to absorb the gases effectively by maintaining a minimum amount of contact space between getter sheet 5 and package 2 in order to maximize exposure of getter sheet 5 to the vacuum space within package 2.

Figure 7C:
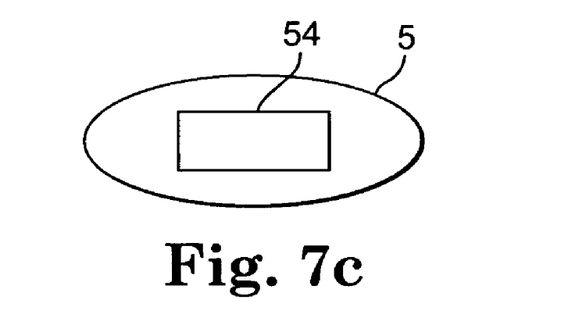
Figure 7D:
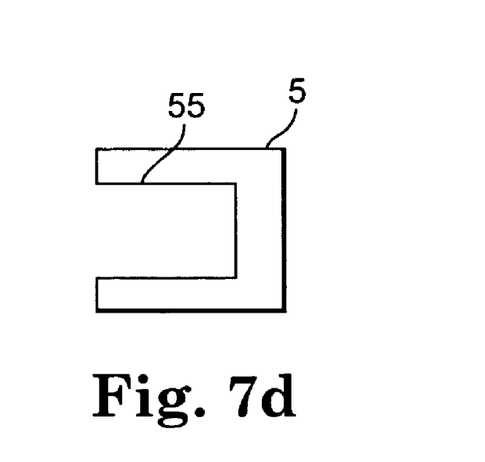
Figure 7E:
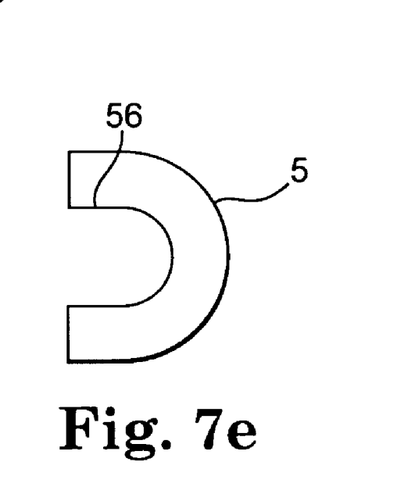

FIG. 7c is a plan view drawing of an elliptical shaped getter sheet 5 including an aperture 54 substantially centered on getter sheet 5 to form an O-shaped getter sheet 5 that allows light to pass to device 6. FIG. 7d is a plan view drawing of a rectangular shaped getter sheet 5 including an aperture 55 located at an edge of getter sheet 5 to form a U-shaped getter sheet 5 that allows light to pass to device 6. FIG. 7e is a plan view drawing of an elliptical shaped getter sheet 5 including an aperture 56 located at an edge of getter sheet 5 to form a U-shaped getter sheet 5 that allows light to pass to device 6. Apertures 54, 55 and 56 comprise light penetration areas created by cutting portions out of getter sheet 5.

As illustrated in FIG. 7c, aperture 54 may be created in getter sheet 5 by cutting a square shape out of getter sheet 5 to block stray light from reaching optical device 9. For example, as illustrated in FIG. 7b, when getter sheet 5 is positioned in an oblique shape within package 2, an aperture 54 may be created in getter sheet 5 with dimensions that allow optical device 9, located beneath getter sheet 5, to be seen through aperture 54.

Furthermore, as illustrated in FIG. 7b, aperture 54 comprises a light penetration area created by cutting out a substantially centered portion of getter sheet 5. In other embodiments, apertures 55 and 56 comprise light penetration areas created by cutting out a portion located at an edge of getter sheet 5. The necessary light may then pass through the light penetration area and reach optical device 9.

In the embodiments illustrated in FIGS. 7d and 7e, since one side of getter sheet 5 is completely open, the edges surrounding aperture 55 or 56 may be utilized substantially similar to tabs 52 or the tabs formed by folding areas 53 from FIGS. 6a-6d. In this way, getter sheet 5 may be effectively secured within package 2 due to the fact that surfaces of the edges surrounding aperture 55 or 56 increase the area of contact with the side surface of cap 4. In this way, the securing characteristics of getter sheet 5 may be enhanced and any movement of getter sheet 5 within package 2 may be effectively prevented. Furthermore, when getter sheet 5 contacts the top surface of the base 3, the edges surrounding aperture 55 or 56 may act as legs to hold getter sheet 5 over the top surface of base 3. In this way, height adjustments can be carried out between getter sheet 5 and optical device 9 mounted on the top surface of base 3.

Various embodiments of the invention have been described. However, the present disclosure is not limited to the embodiments described herein. These and other embodiments are within the scope of the following claims. Embodiments including modifications or changes are applicable to the extent of operation and description of the disclosure. For example, the present invention is applicable to various kinds of devices mounted within a package, such as infrared detectors or angular velocity detectors, wherein a getter sheet is secured within the package.

The invention claimed is:

1. A package element comprising:
a package that includes a base and a cap; and
a getter sheet positioned between the base and the cap with at least one portion of the getter sheet in contact with the package to secure the getter sheet within the package in a condition of elastic deformation.

2. The package element of claim 1, further comprising:
an electronic device mounted on a top surface of the base within the package.

3. The package element of claim 2, wherein the device comprises an optical sensor.

4. The package element of claim 1, wherein the condition of elastic deformation of the getter sheet forces the getter sheet into a vaulted form within the package.

5. The package element of claim 1, wherein the getter sheet comprises one of a rectangular shape, an elliptical shape, or an octagonal shape.

6. The package element of claim 1, wherein the getter sheet is secured within the package when the at least one portion of the getter sheet contacts one or more of a side surface of the cap, a bottom surface of the cap, or a top surface of the base.

7. The package element of claim 1, wherein the getter sheet is positioned in one of a dome shape, an inverted-dome shape, or an oblique shape between the base and the cap.

8. The package element of claim 1, wherein the getter sheet is secured within the package in a dome shape when two ends of the getter sheet contact a top surface of the base and a side surface of the cap.

9. The package element of claim 1, wherein the getter sheet is secured within the package in an inverted-dome shape when two ends of the getter sheet contact a bottom surface of the cap and a side surface of the cap.

10. The package element of claim 1, wherein the getter sheet is secured within the package in an oblique shape when one end of the getter sheet contacts a bottom surface of the cap and a side surface of the cap and another end of the getter sheet contacts a top surface of the base and the side surface of the cap.

11. The package element of claim 1, wherein the cap includes at least one lug positioned adjacent a side surface of the cap, and wherein the getter sheet is secured within the package when at least one end of the getter sheet contacts the at least one lug.

12. The package element of claim 11, wherein the at least one end of the getter sheet includes a notch, and wherein the getter sheet is secured within the package when the at least one end of the getter sheet that includes the notch clamps onto the at least one lug.

13. The package element of claim 1, wherein the cap includes a lug ring positioned adjacent an entire side surface of the cap, and wherein the getter sheet is secured within the package when at least one end of the getter sheet contacts the lug ring.

14. The package element of claim 1, wherein the base includes at least one slope area, and wherein the getter sheet is secured within the package when at least one end of the getter sheet is inserted between the at least one slope area and a side surface of the cap.

15. The package element of claim 1, wherein the getter includes at least one tab on at least one end of the getter sheet, and wherein the getter sheet is secured within the package when the at least one tab contacts one or more of a side surface of the cap, a bottom surface of the cap, and a top surface of the base.

16. The package element of claim 1, further comprising:
an optical device mounted on a top surface of the base within the package, wherein the cap includes an optical transmission window and the getter sheet includes an aperture to allow light to pass through the optical transmission window and the aperture to the optical device.

17. The package element of claim 16, wherein the optical transmission window substantially covers a light-intake area within the package located on a top surface of the cap outside of the package.

18. The package element of claim 16, wherein said the aperture is substantially centered on the getter sheet and forms an O-shaped getter sheet.

19. The package element of claim 16, wherein the aperture is located at an edge of the getter sheet and forms a U-shaped getter sheet.

20. The package element of claim 1, wherein the getter sheet absorbs gasses within the package.

21. A method comprising:
assembling a package with a base and a cap; and
securing a getter sheet within the package in a condition of elastic deformation by positioning the getter sheet between the base and the cap with at least one portion of the getter sheet in contact with the package.

22. The method of claim 21, wherein securing the getter sheet comprises positioning the getter sheet with the at least one portion of the getter sheet in contact with one or more of a side surface of the cap, a bottom surface of the cap, and a top surface of the base.

23. The method of claim 21, wherein positioning the getter sheet comprises positioning the getter sheet in one of a dome shape, an inverted-dome shape, or an oblique shape between the base and the cap.

24. The method of claim 21, wherein the cap includes at least one lug positioned adjacent a side surface of the cap, and wherein securing the getter sheet comprises positioning the getter sheet with at least one end of the getter sheet in contact with the at least one lug.

25. The method of claim 24, wherein the at least one end of the getter sheet includes a notch, and wherein securing the getter sheet comprises clamping the at least one end of the getter sheet that includes the notch onto the at least one lug.

26. The method of claim 21, wherein the cap includes a lug ring positioned adjacent an entire side surface of the cap, and wherein securing the getter sheet comprises positioning the getter sheet with at least one end of the getter sheet in contact with the lug ring.

27. The method of claim 21, wherein the base includes at least one slope area, and wherein securing the getter sheet comprises inserting at least one end of the getter sheet between the at least one slope area and a side surface of the cap.

28. The method of claim 21, wherein the getter includes at least one tab on at least one end of the getter sheet, and wherein securing the getter sheet comprises positioning the getter sheet with the at least one tab in contact with one or more of a side surface of the cap, a bottom surface of the cap, and a top surface of the base.

29. The method of claim 21, further comprising:
mounting an optical device on a top surface of the base within the packet;
allowing light to pass through an optical transmission window included in the cap into the package; and
allowing the light within the package to pass through an aperture included in the getter sheet to the optical device.

30. A package element comprising:
means for forming a vacuum enclosure; and
means for absorbing gasses within the vacuum enclosure positioned with at least one portion of the means in contact with the vacuum enclosure to secure the means within the vacuum enclosure in a condition of elastic deformation.

* * * * *